United States Patent [19]

Crowley

[11] Patent Number: 4,528,523
[45] Date of Patent: Jul. 9, 1985

[54] FAST TUNED PHASE LOCKED LOOP FREQUENCY CONTROL SYSTEM

[75] Inventor: Albert T. Crowley, Somerdale, N.J.

[73] Assignee: RCA Corporation, Princeton, N.J.

[21] Appl. No.: 451,423

[22] Filed: Dec. 20, 1982

[51] Int. Cl.$^3$ .............................................. H03L 7/06
[52] U.S. Cl. ...................................... 331/10; 331/14; 331/16
[58] Field of Search .................... 331/10, 14, 16, 17, 331/18

[56] References Cited

U.S. PATENT DOCUMENTS 3,676,794  7/1972  Bidell et al. .................. 331/1 A X
4,105,948  8/1978  Wolkstein ..................... 331/16 X

FOREIGN PATENT DOCUMENTS 0063936  4/1982  Japan ........................... 331/10

*Primary Examiner*—Eugene R. LaRoche
*Assistant Examiner*—Robert J. Pascal
*Attorney, Agent, or Firm*—Joseph S. Tripoli; Robert L. Troike; William H. Meise

[57] ABSTRACT

An improved circuit for rapidly locking the phase of a reference signal $e_r$ of frequency $f_r$ with the phase of a signal $e_{VCO}$ in a phase locked loop which comprises a voltage controlled oscillator (VCO) for generating the signal $e_{VCO}$ of frequency $f_{VCO}$, a divide-by-N circuit, for dividing $f_{VCO}$ by a variable N, a frequency/phase detector responsive to the phases of $e_{VCO}$ and $e_r$ to supply a control signal $e_c$ to the VCO, a loop filter circuit comprising a resistor and a capacitor for filtering $e_c$, and logic for changing N to a new value N′ in a time interval not less than T. Also provided is a circuit responsive to each change of N for coarse tuning the control signal supplied to the VCO and comprising a voltage generator responsive to each new value N′ of N for generating a coarse tuned voltage having a magnitude which, when applied across the capacitor, will change the frequency $f_{VCO}/N$ to $f_{VCO}/N'$ to approximate $f_r$. Gating logic responds to each change in N to disconnect the output of the frequency/phase detector and coincidentally to supply the coarse tuned voltage across the capacitor for a time interval Δ, where Δ<<T, and then to reconnect the output of the frequency/phase detector.

11 Claims, 1 Drawing Figure

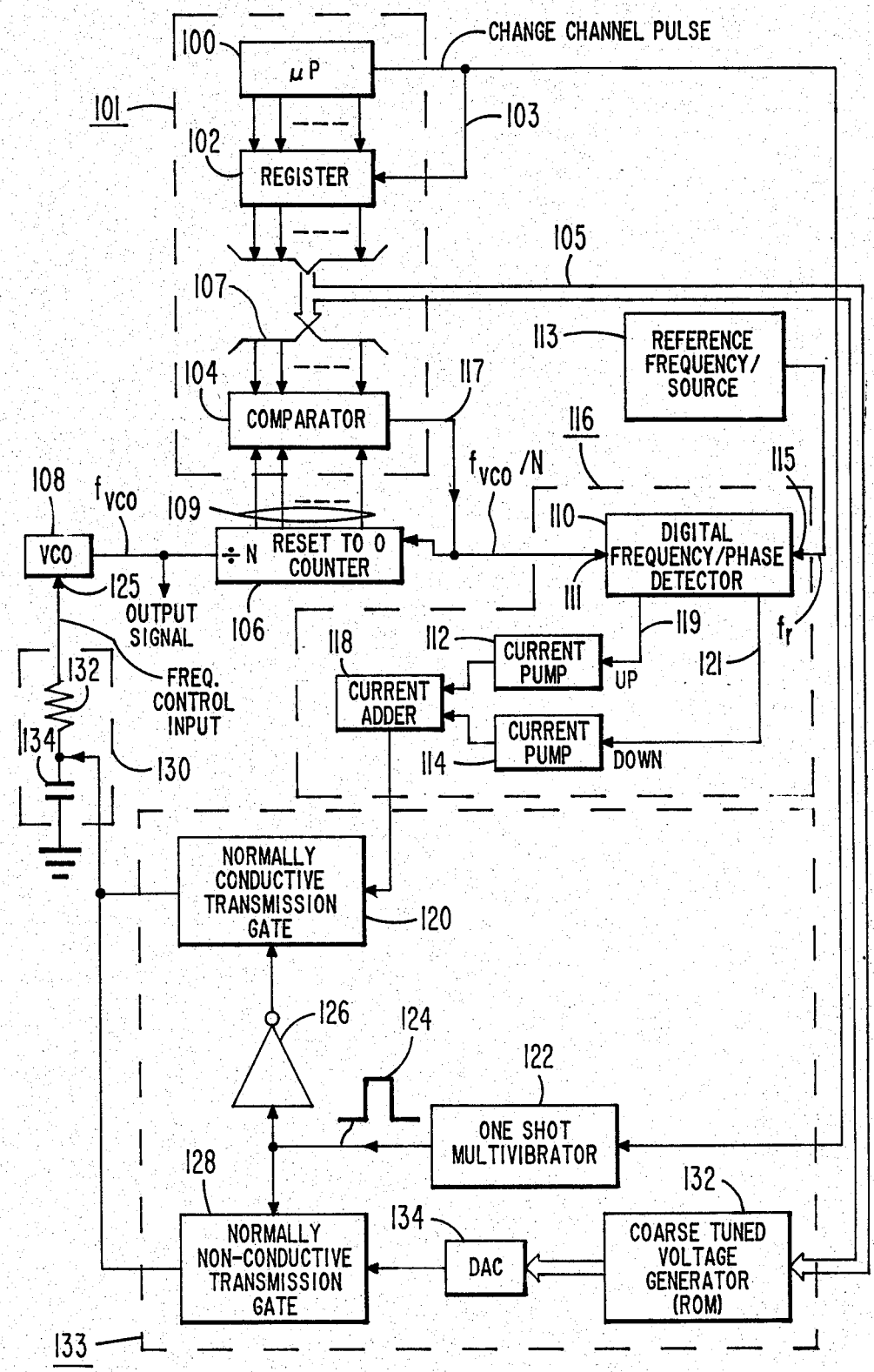

FAST TUNED PHASE LOCKED LOOP FREQUENCY CONTROL SYSTEM

The United States Government has rights in this invention under Government Contract No. DAAK20-81-C-0376 awarded by the Department of the Army.

This invention relates generally to a phase locked loop frequency control system and more particularly to logic for fast tuning the frequency of such a system.

Many digital frequency synthesizers employ a phase locked loop circuit comprising a voltage controlled oscillator (VCO) whose output signal at a frequency of $f_{VCO}$ is supplied to a divide-by-N divider. The output frequency of the divider $f_{VCO}/N$ in turn is supplied to a phase detector. A reference frequency $f_r$ is also supplied to the phase detector which compares $f_r$ with $f_{VCO}/N$ to produce a frequency control signal $e_c$ which is supplied to the frequency control input of the VCO through a loop filter circuit. By well known principles $f_{VCO}/N$ will become equal to $f_r$. By changing the value of N the VCO output frequency will also change so that its divided down frequency $f_{VCO}/N$ will remain equal to $f_r$. However, because of constraints put upon the system by the loop filter the changing of the frequency $f_{VCO}$ is relatively slow. To speed up the attainment of the new $f_{VCO}$ prior slow. To speed up the attainment of the new $f_{VCO}$ prior art schemes apply a coarse tuning voltage to the frequency control input of the VCO to pre-position it to the approximate final output frequency $f_{VCO}$. The usual method of such coarse tuning is to add a dc voltage to the loop error voltage, i.e., the output of the phase detector whenever a new output frequency is desired. A disadvantage of such prior art schemes is that the coarse voltage is continuously applied. Hence, any noise on the coarse tuning voltage will cause frequency modulated (FM) noise to be generated by the VCO. If the coarse tuning voltage is filtered to reduce noise, the time delay added by this filter will increase the settling time.

The present invention provides a coarse tuning circuit that avoids the difficulties mentioned above in that it coarse tunes the VCO output frequency rapidly and without the perturbations normally caused by noise in prior art schemes.

In a preferred embodiment of the invention there is provided, in a phase locked loop for locking the phase of a reference signal $e_r$ of frequency $f_r$ to the phase of an input signal $e_{VCO}$ and comprising a voltage controlled oscillator (VCO) for generating a signal $e_{VCO}$ of frequency $f_{VCO}$, a divide-by-N circuit, a frequency/phase detector responsive to the phases of $e_{VCO}$ and $e_r$ to supply a frequency control signal $e_c$ to the VCO, a loop filter circuit comprising a resistor and a capacitor for filtering $e_c$, and logic for changing N to a new value N' at time intervals not less than T, an improved circuit responsive to each change of N for coarse tuning the control signal supplied to the VCO and comprising a voltage generator responsive to each new value N' for generating a coarse tuned voltage having a magnitude which, when impressed across the capacitor, will change the frequency $f_{VCO}$ so that the new $f_{VCO}/N$ will approximate $f_r$, and gating logic responsive to each change in N to disconnect the output of the frequency/phase detector and coincidentally to supply the coarse tuned voltage across the capacitor for a time interval $\Delta$ where $\Delta << T$, and then to reconnect the output of the frequency/phase detector.

In the sole FIGURE (FIG. 1) there is shown a block diagram of a preferred form of the invention.

FIG. 1 includes a conventional phase locked loop consisting of VCO 108 whose frequency output $f_{VCO}$ is supplied to a divide-by-N counter 106 to produce an output frequency $f_{VCO}/N$ which is supplied to an input 111 of digital frequency/phase detector 110. A reference frequency source 113 supplies a reference signal of frequency $f_r$ to the second input 115 of digital frequency/phase detector 116.

There are two outputs 119 and 121 from digital frequency/phase detector 110 which are, respectively, positive and negative in nature and depending upon the phase relationship of $f_{VCO}/N$ and $f_r$, energizes either current pump 112 or current pump 114. The two current pumps 112 and 114 respectively supply positive or negative analog currents to current adder 118 which in turn supplies a combined output current through normally conductive transmission gate 120 to frequency control input 125 of VCO 108. VCO 108 responds to such frequency control input to cause its output frequency $f_{VCO}$ to become equal to $Nf_r$ in a well known manner. The filter 130, consisting of resistor 132 and capacitor 134 smoothes the output of current adder 118 and provides a predetermined loop filter bandwidth for the system of about 10% of $f_r$.

Also part of the prior art is the logic within the dashed line block 101 which consists of logic for changing the value of N in divider 106. More specifically, a suitable control source such as microprocessor 100 will, in response to certain conditions, supply a value N to register 102 which will then, in response to a change channel pulse appearing on the lead 103, will be supplied to input terminals 107 of comparator 104. Also supplied to comparator 104 via leads 109 is the current count value of counter 106. When the count value of a counter 106 reaches the value N appearing in register 102 the comparator 104 will supply a correlation output signal via lead 117 which will indicate that counter 106 has attained a count value equal to N and will reset counter 106 to 0 and also supply a pulse to digital frequency/phase detector 110. It is to be noted that the output terminal of comparator 104 is, in fact, the terminal on which the signal having the frequency $f_{VCO}/N$ appears. It is apparent that if a new value of N is placed in register 102 the comparator 104 will output a signal on its output terminal 117 each time counter 106 counts to the new value N. In this manner the count capacity of counter 106 is effectively changed to change the frequency of the signal supplied to the detector 110.

The inventive portion of the circuit is primarily contained within dashed block 133 and includes coarse tune voltage word generator 132, (which can be a ROM) a digital-to-analog converter (DAC) 134, a normally non-conductive transmission gate 128 the output of which is connected across the capacitor 134 of loop filter 130, also employed as part of the inventive portion of the circuit. Further included within block 133 is a one-shot multivibrator 122 the output of which is responsive to each change of channel pulse appearing on lead 103 to cause the normally conductive transmission gate 120 to become non-conductive (through inverter 126) for the duration of the output pulse 124 of one-shot multivibrator 122, and to cause normally non-conductive transmission gate 128 to become conductive for such duration of pulse 124. Thus, the normally conductive transmission gate 120 and the normally non-conductive transmission gate 128 in cooperation with inverter 126 form a multiplexing circuit under control of the output of one-shot multivibrator 122.

Consider the operation of the logic within block 133 more specifically. Upon the occurrence of every change of channel pulse appearing on the output lead 103 of microprocessor 100 the one-shot multivibrator 122 generates an output pulse 124 which causes transmission gate 120 to become non-conductive for the duration thereof and transmission gate 128 to become conductive for the duration thereof. Simultaneously, a new value of N appears in register 102 and is supplied via bus 105 as an address to the input of coarse tuned voltage word generator 132, which is preferaly a ROM. The value N supplied to ROM 132 accesses a memory location thereof, the contents of which is a digital word that represents the coarse voltage required to approximately tune the VCO to the new output frequency. The word is supplied to DAC 134 which converts such digital words to analog voltage, which is in turn supplied through the now conductive transmission gate 128 across the capacitor 134 in loop filter 130. The charge across capacitor 134 will change to the peak value output of DAC 134 during the time duration of output pulse 124 of multivibrator 122.

The new voltage appearing across capacitor 134 now becomes the frequency control input signal to VCO 108 and will cause the frequency $f_{VCO}$ of the output of VCO 108 to very rapidly tune to the approximate new frequency demanded by the change in the value of N appearing in register 102 which, as discussed above, is the new count capacity of counter 106. It should be specifically noted that the contents of the memory location accessed in ROM 132 by the new value of N has a value which, when converted to an analog value by DAC 134, is of the proper magnitude to make such coarse adjustments in $f_{VCO}$.

At the end of the duration of pulse 124 transmission gate 120 will return to its normally conductive state and transmission gate 128 will return to its normally non-conductive state so that the logic in block 133 is now effectively out of the circuit.

The output of the digital frequency/phase detector 110 will now be responsive to the new coarse value of $f_{VCO}/N$ and will modify the new voltage appearing across capacitor 134 to pull in $f_{VCO}$ to a phase locked condition. Since the coarse tune voltage has been disconnected from the capacitor 134, the coarse tune voltage cannot contribute any noise components which would cause undesirable modulation of the VCO output frequency.

It is to be understood that the time duration of the output pulse 124 from multivibrator 122 is very short and can be less than the period of a cycle of the frequency $f_{VCO}/N$ and less than the time duration of the change of channel command pulses generated by microprocessor 100 on output lead 103.

A digital frequency/phase detector and current pumps 112 and 114 suitable for use in the present invention are shown and described in detail in a publication entitled "Charge-Pump Phase-Lock Loops" by Floyd M. Gardner, appearing in the November, 1980 issue of the "IEEE Transactions on Communications", Vol. Com-28, No. 11, pages 1849–1858, and incorporated herein by reference. The structure of the publication has capability of pulling into sync a signal having a frequency difference as well as a phase difference.

I claim:

1. In a phase locked loop for locking the phase of a reference signal $e_r$ of frequency $f_r$ to the phase of a signal $e_{VCO}$ and comprising in tandem, a voltage controlled oscillator (VCO) for generating $e_{VCO}$ of frequency $f_{VCO}$, a divide-by-N circuit for dividing $f_{VCO}$ to produce a signal $e_N$ of frequency $f_{VCO}/N$, a frequency/phase detector responsive to the phase of $e_N$ and $e_r$ to supply a control signal $e_c$ over a control conductor to said VCO, and a loop filter circuit comprising a resistor coupled in series with said control conductor and a capacitor coupled between said control conductor and a point of reference potential for filtering $e_c$, and a means for changing N to a new value N', a circuit responsive to each change of N for rapidly coarse tuning the control signal supplied to said VCO and comprising:
   means responsive to each new value N' of N for generating a coarse tuned voltage having a magnitude which, when impressed across said capacitor, will change the frequency $f_{VCO}/N$ so that the new frequency $f_{VCO}/N$, will approximate $f_r$; and
   means responsive to each change in N to disconnect the output of said frequency/phase detector and coincidentally to supply said coarse tuned voltage across said capacitor for a time interval Δ and to reconnect the output of said frequency/phase detector and disconnect said coarse tuned voltage from said capacitor at times other than said time interval Δ.

2. In a phase locked loop for locking the phase of a reference signal frequency $f_r$ to the phase of a signal of frequency $f_{VCO}$ and comprising in tandem, a voltage controlled oscillator (VCO) responsive to a control signal $e_c$ applied to a control input terminal to generage $f_{VCO}$, a divide-by-N circuit for dividing $f_{VCO}$ by N to produce a signal $e_N$ of frequency $f_{VCO}/N$, where N is variable, loop filter means including an output terminal coupled to said control input terminal of said VCO and also including an input terminal, a phase detector means responsive to the phases of $f_r$ and $f_{VCO}/N$ to generate and supply an error signal to said input terminal of said loop filter means which responds thereto to supply said control signal $e_c$ to said VCO, a fast VCO coarse tuning circuit comprising:
   first means responsive to each new value of N=N' to generate a coarse voltage which, when applied to said loop filter means, will change $f_{VCO}/N$ to $f_{VCO}/N'$; and
   second means responsive to each change in N to simultaneously decouple said input terminal of said loop filter means from said phase detector and couple said input terminal of said loop filter means to said first means in order to substitute said coarse voltage for $e_c$ and to open the output of said phase detector for a short time interval following said change in N and to simultaneously decouple said input terminal of said loop filter means from said first means and couple said input terminal of said loop filter means to said phase detector means after said short time interval.

3. A fast VCO coarse tuning circuit as in claim 2 in which said second means comprises:
   means responsive to each change of the value of N to generate a timing pulse including first and second states; and
   gating means responsive to said timing pulse to decouple the output of said phase detector means from said input terminal of said loop filter means and to couple said first means to said input terminal of said loop filter means in said first state of said timing pulse, and to couple said output of said phase detector means to said input terminal of said loop filter means and to decouple said first means from said input terminal of said loop filter means in said second state of said timing pulse.

4. A fast VCO coarse tuning circuit as in claim 2 in which said first means comprises:
a storage means having a plurality of addressable word locations and responsive to N to output a digital representation of said coarse voltage; and
a digital-to-analog converter for converting said digital representation to said control signal $e_c$.

5. A fast VCO coarse tuning circuit as in claim 2 in which said loop filter means comprises a capacitor across which said coarse voltage is supplied.

6. In a phase locked loop for locking the phase of a reference signal $e_r$ to the phase of a signal $e_{VCO}$ and comprising in tandem, a variable controlled oscillator (VCO) for generating $e_{VCO}$, a divide-by-N circuit where N is changed at intervals having a period not less than T, a frequency/phase detector responsive to the phases of $e_{VCO}$ and $e_r$ to generate a signal $e_\phi$, and a loop filter responsive to $e_\phi$ to generate and supply to said VCO a control signal $e_c$ whose amplitude is proportional to the time integration of $e_\phi$, a circuit for rapidly coarse adjusting $f_{VCO}$ to a new $f'_{VCO}$ when the value of N is changed to N' comprising:
means responsive to each new value N' for generating a second control signal $e'_c$ which, when substituted for $e_c$ in said loop filter will change $f_{VCO}$ so that $f_{VCO}/N' \cong f_r$; and
means responsive to each change of N to replace $e_c$ with $e'_c$ for a time interval $\Delta < T$.

7. In a phase locked loop system including a voltage controlled oscillator (VCO) having a frequency control input and responsive to a control signal $e_c$ to produce a nominal frequency $f_{VCO}$, means for dividing $f_{VCO}$ by a variable number N, phase/frequency detector means including an input terminal, a reference signal source of frequency $f_r$ coupled to said input terminal of said phase/frequency detector means, where $f_r = f_{VCO}/N$, means for changing the value of N, and a loop filter means including a resistor and a capacitor for filtering and supplying the output of said phase detector means to the frequency control input of said VCO, a method of fast coarse tuning $f_{VCO}$ to a new $f_{VCO}$ when the value of N is changed comprising the steps of:
generating a coarse tuning voltage of a value selected to coarse tune $f_{VCO}$ to a new $f_{VCO}$ to reflect a change in the value of N;
connecting said coarse tuning voltage across said capacitor for a predetermined interval of time each time the value of N is changed to charge said capacitor to a voltage near said coarse tuning voltage,
disconnecting said coarse tuning voltage from said capacitor at times other than said predetermined interval; and
disconnecting the output of said frequency/phase detector from said loop filter means during said predetermined interval of time.

8. An improved phase-locked loop for locking the phase of an output signal to the phase of an input signal, comprising:
a source of input signal;
a voltage-controlled oscillator including a frequency control input terminal for generating said output signal;
a controllable frequency divider coupled to said voltage-controlled oscillator for dividing the frequency of said output signal to form a divided-frequency signal;
a frequency/phase detector coupled to said source of input signal and to said controllable frequency divider for comparing said input signal with said divided-frequency signal for forming at an output terminal a voltage-controlled-oscillator control signal representing the frequency and phase error therebetween;
filter means including an input terminal for receiving said voltage-controlled-oscillator control signals, and also including an output terminal for generating filtered voltage-controlled oscillator control signals;
coupling means coupled to said output terminal of said frequency/phase detector, to said input terminal of said voltage-controlled oscillator and to said filter means for coupling said filtered voltage-controlled oscillator control signals to said voltage-controlled oscillator for forming a controllable degenerative phase-lock loop for urging the frequency and phase of said divided-frequency signal towards the frequency and phase of said input signal, said coupling means further including a controllable switch for opening said phase-lock loop;
divider control means coupled to said controllable frequency divider and to said switched coupling means for generating digital control signals representing one of a plurality of preselected division ratios for controlling the frequency division ratio of said controllable frequency divider and for operating said switch for opening said degenerative phase-lock loop;
digital-to-analog conversions means including input terminals for receiving digital signals and also including an output terminal coupled to said coupling means for coupling signal to said voltage-controlled oscillator via said filter means for coarse tuning thereof;
wherein the improvement lies in coarse tuning memory means coupled to said divider control means, to said digital-to-analog conversion means and to said coupling means for receiving said digital control signals representing one of a plurality of preselected division ratios and for applying said digital control signals as addresses to a preprogrammed memory for generating a particular voltage-representative digital signal in response to each of said digital control signals, and for applying said voltage-representative digital signal to said input terminals of said digital-to-analog-conversion means whereby coarse tuning of said voltage-controlled oscillator is accomplished by an analog voltage selected to be near that value which when applied to said voltage-controlled oscillator sets said frequency of said output signal of said voltage-controlled oscillator to equal the frequency of said input signal multiplied by said division ratio rather than by an analog voltage representation of said division ratio.

9. A phase-locked loop according to claim 8 wherein said coupling means further comprises second switch means coupled to said ouput terminal of said digital-to-analog conversion means for coupling said output terminal of said digital-to-analog conversion means for control of said voltage-controlled oscillator during those intervals in which said degenerative phase-locked loop is open and inoperative, and for decoupling said output terminal of said digital-to-analog conversion means for control of said voltage-controlled oscillator during those intervals in which said degenerative phase-locked loop is closed and operative.

10. An improved phase-locked loop for locking the phase of an output signal to the phase of an input signal, comprising:

a VCO including a control input terminal for generating said output signal;

a controllable frequency divider coupled to said VCO for dividing the frequency of said output signal to form a divided signal;

a source of input signal;

a phase comparison means coupled to said frequency divider and to said source of input signal for comparing said divided signal with said input signal for generating a raw control voltage indicative of the frequency/phase difference therebetween;

loop filter means;

feedback coupling means coupled to said loop filter means, to said phase comparison means and to said control input terminal of said VCO for coupling said raw control voltage to said loop filter means for generating a filtered loop control voltage and for coupling said filtered loop control voltage to control said VCO in a degenerative phase-locked loop controlling the frequency and phase of said output signal;

channel selecting means coupled to said frequency divider for generating a divider control signal for selecting the frequency division ratio of said frequency divider for selecting the frequency of said output signal, whereby the change from one channel to another may undesirably be delayed due to the time necessary for said frequency divider to produce said divided signal at a new frequency;

comparator means coupled to said channel selecting means and to said feedback coupling means for coupling said divider control signal to said phase-lock loop in such a manner as to immediately urge said frequency of said output signal towards a new desired frequency upon selection of said new desired frequency thereby reducing said undesirable delay, whereby continued application of said divider control signal to said phase-lock loop at times during which said phase-lock loop has stabilized the frequency and phase of said output signals tends to undesirably introduce frequency/phase noise into said output signal;

wherein the improvement comprises switch means coupled to said feedback coupling means and to said channel selecting means for decoupling said divider control signal from control of said VCO at said times during which said phase-lock loop has stabilized.

11. A phase-locked loop according to claim 10 further comprising second switch means coupled to said feedback coupling means for decoupling said phase comparison means from control of said VCO during times other than said times during which said phase-lock loop has stabilized.

* * * * *